United States Patent
Ridder et al.

(10) Patent No.: US 8,338,210 B2
(45) Date of Patent: Dec. 25, 2012

(54) METHOD FOR PROCESSING SOLAR CELL SUBSTRATES

(75) Inventors: de Chris G. M. Ridder, Almere (NL);
Klaas P. Boonstra, Almere (NL);
Adriaan Garssen, Almere (NL); Frank Huussen, Almere (NL)

(73) Assignee: ASM International N.V., Almere (NL)

( * ) Notice: Subject to any disclaimer, the term of this patent is extended or adjusted under 35 U.S.C. 154(b) by 0 days.

(21) Appl. No.: 12/814,899

(22) Filed: Jun. 14, 2010

(65) Prior Publication Data

US 2011/0306159 A1    Dec. 15, 2011

(51) Int. Cl.
*H01L 21/00* (2006.01)

(52) U.S. Cl. ............... 438/57; 211/41.17; 211/41.18

(58) Field of Classification Search .......... None
See application file for complete search history.

(56) References Cited

U.S. PATENT DOCUMENTS

| | | | |
|---|---|---|---|
| 4,545,327 A | | 10/1985 | Campbell et al. |
| 4,721,427 A | * | 1/1988 | Sanders et al. ........ 414/416.12 |
| 4,738,618 A | | 4/1988 | Massey et al. |
| 5,125,359 A | * | 6/1992 | Barale et al. ............... 118/725 |
| 5,169,478 A | * | 12/1992 | Miyamoto et al. ....... 156/345.37 |
| 6,335,295 B1 | | 1/2002 | Patel |
| 2009/0035946 A1 | * | 2/2009 | Pierreux et al. ............. 438/763 |
| 2009/0294777 A1 | * | 12/2009 | Cheng et al. ................ 257/77 |

* cited by examiner

*Primary Examiner* — Julio J Maldonado
*Assistant Examiner* — Shantanu C Pathak
(74) *Attorney, Agent, or Firm* — Weingarten, Schurgin, Gagnebin & Lebovici LLP (57) ABSTRACT

A method for processing solar cells comprising:
  providing a vertical furnace to receive an array of mutually spaced circular semiconductor wafers for integrated circuit processing;
  composing a process chamber loading configuration for solar cell substrates, wherein a size of the solar cell substrates that extends along a first surface to be processed is smaller than a corresponding size of the circular semiconductor wafers, such that multiple arrays of mutually spaced solar cell substrates can be accommodated in the process chamber,
  loading the solar cell substrates into the process chamber;
  subjecting the solar cell substrates to a process in the process chamber.

11 Claims, 6 Drawing Sheets

METHOD FOR PROCESSING SOLAR CELL SUBSTRATES

FIELD OF THE INVENTION

The present invention relates to the field of processing of planar thin semiconductor substrates such as solar cells, and more in particular to the processing of solar cell substrates in a vertical furnace.

BACKGROUND

It is commonly known that different kinds of furnaces may be used to process substrates such as substantially circular wafers for integrated circuit processing. A first kind of furnace comprises a horizontal furnace having a process chamber that substantially extends in a horizontal direction. To process said circular wafers, the wafers are loaded into the process chamber such that the respective wafers are oriented substantially vertically and arranged substantially parallel. Another kind of furnace comprises a vertical furnace with a process chamber arranged in said furnace such that a central axis of the process chamber substantially coincides, or at least extends in a substantially similar direction, with a central axis of the vertical furnace. Before processing wafers in a vertical furnace, the wafers are provided in a loading configuration wherein the wafers are substantially horizontally oriented and are mutually spaced in a vertical direction wherein the centre points of the wafers are approximately positioned on the central axis of the process chamber. Vertical furnaces usually have a load size of 100-150 wafers that are spaced apart such that during processing of the respective wafers the entire surface of each substrate can be subjected to the process. In order to enable the substrate to be exposed to one or more volatile precursors, which may react and/or decompose on the substrate surface to produce a desired thin film, a certain minimal space needs to be available between adjacent substrates. Consequently, the load size of vertical furnaces is limited and determined by the size of the respective furnace and kind of process used to apply a thin film on the wafers provided in said furnace. At the same time, a vertical furnace can be automated more easily than a horizontal furnace.

Due to increasing demand of thin semiconductor substrates such as solar cells, it is desired to enhance the throughput of substrates to be processed in such a vertical furnace. Therefore, it is an object of the present invention to provide for an improved method to process planar thin semiconductor substrates such as solar cells in a known furnace. More in particular an object of the invention is to provide a method to process solar cells in a vertical furnace with an increased throughput.

SUMMARY OF THE INVENTION

According to one aspect of the invention a method for processing solar cells is provided. The method may comprise providing a vertical furnace configured for batch processing. Said vertical furnace may be provided with a substantially cylindrical, vertically extending process chamber that is adapted to receive an array of circular semiconductor wafers for integrated circuit processing. The method may further comprise composing a suitable process chamber loading configuration for solar cell substrates having a first surface to be processed. A size of the solar cell substrates that extends along the first surface is smaller than a corresponding size of said circular semiconductor wafers such that multiple arrays of mutually spaced solar cell substrates can be accommodated in the process chamber. The loading configuration may comprises multiple arrays of solar cell substrates, wherein each array comprises a plurality of solar cell substrates that are substantially vertically oriented and substantially horizontally spaced apart, wherein the respective arrays are provided at a plurality of levels located along a central axis of the process chamber in the vertical furnace. A number of solar cell substrates that can be accommodated in the process chamber may be substantially larger than a number of circular semiconductor wafers. The method may also comprise loading the solar cell substrates into the process chamber of the vertical furnace. Subsequently, the solar cell substrates may be subjected to a process in the process chamber.

By using the proposed method to process solar cell substrates, the prejudice that large industrial vertical furnaces are only suitable to process a single array of horizontally oriented and vertically spaced semiconductor wafers for integrated circuit processing is overcome. The vertically extending process chamber that is arranged in a known vertical furnace may be loaded such that, surprisingly, multiple arrays of solar cell substrates may be processed in a single batch, thereby maintaining the advantages of a vertical furnace and increasing the amount of substrate surfaces that can be processed at the same time. Consequently, by using the provided method, solar cells may be produced in a cost efficient way in a furnace that can be automated in a simple manner.

With regard to the state of the art, the following is noted.

U.S. Pat. No. 6,335,295 discloses a method for performing wet oxidation for forming an oxygen containing layer on a semiconductor surface. The furnace comprises a process chamber adapted to receive wafers that are supported on a quartz boat. Said boat is a ladder arrangement of horizontal quartz wafer support structures cut or held in place by three or more vertical rails. The quartz boat may hold between 100 and 200 wafers, in one or more vertically spaced arrays of wafers, arranged around a central vertical gas inlet column.

U.S. Pat. No. 4,545,327 shows a chemical vapour deposition device having a dome shaped deposition reaction chamber with spaced heating elements that are selected to provide controlled temperature condition within the reaction chamber. The chamber is adapted to receive vertically oriented substrates such as semiconductor wafers that are supported on boats resting on rods on the chamber base.

Furthermore, U.S. Pat. No. 4,738,618 discloses a vertically oriented thermal processor for the processing of silicon or gallium arsenide wafers or substrates. The processor comprises a load chamber adapted to receive a wafer boat and silicon or gallium, arsenide wafers or substrates provided in a single array.

The mentioned state of the art documents fail to disclose a loading configuration especially suitable for processing a large load size of relatively small solar cell substrates in a vertical furnace.

The aforementioned and other features and advantages of the invention will be more fully understood from the following detailed description of certain embodiments of the invention, taken together with the accompanying drawings, which are meant to illustrate and not to limit the invention.

BRIEF DESCRIPTION OF THE DRAWINGS

It is noted that identical or corresponding elements in the different drawings are indicated with identical or corresponding reference numerals.

DETAILED DESCRIPTION

Figure 1:
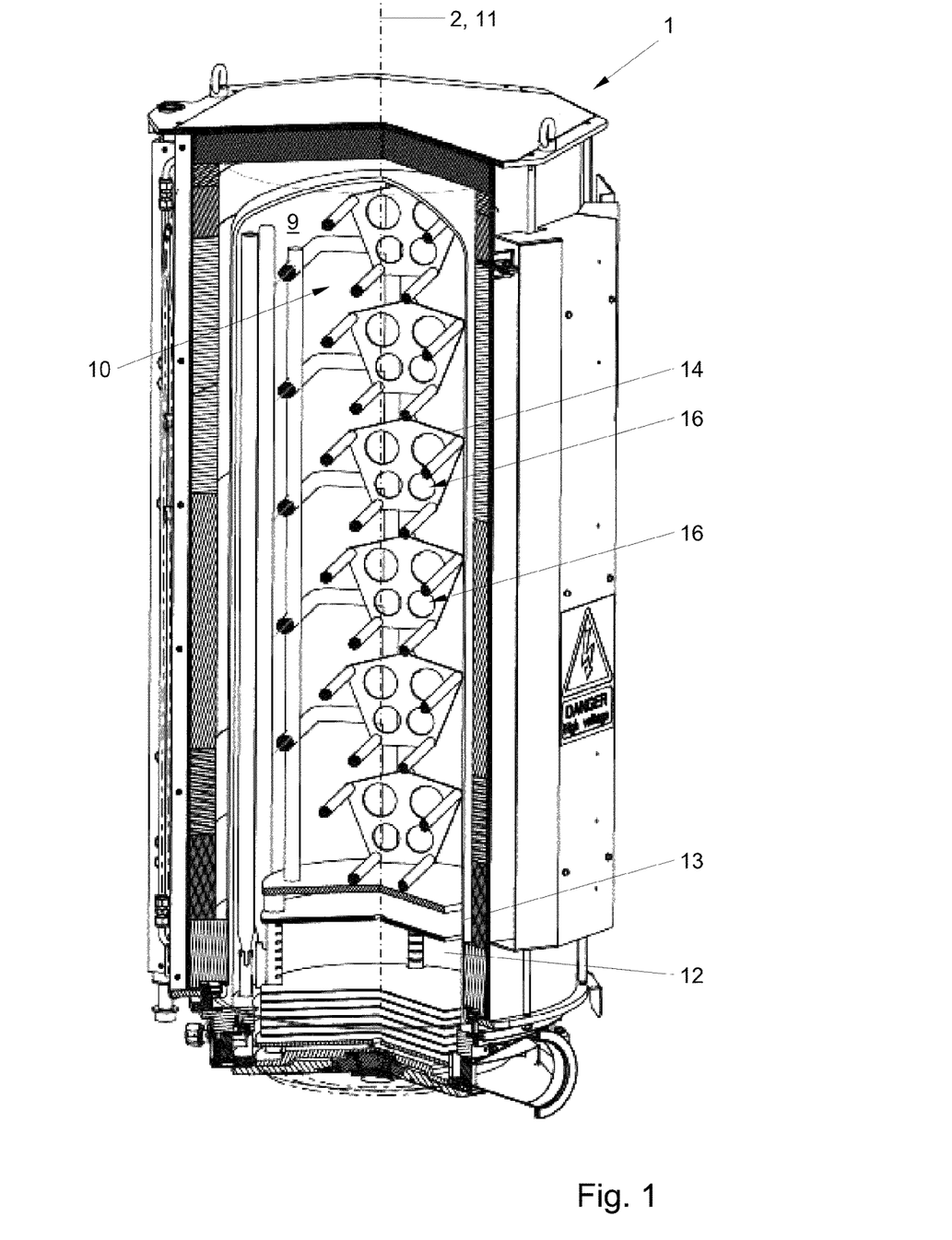
FIG. 1 shows a perspective view of a vertical furnace adapted for processing semiconductor wafers provided with a substrate rack for solar cell substrates.

In FIG. 1, an example of a vertical furnace 1 for batch processing of circular semiconductor wafers for integrated circuit processing is shown. Such a vertical furnace 1 comprises a substantially cylindrical process chamber 10. A central axis 11 of the process chamber 10 substantially coincides with a central axis 2 of the vertical furnace 1. The process chamber 10 of the shown vertical furnace 1 is adapted to receive an array of circular semiconductor wafers for integrated circuit processing such that said wafers may be processed to apply a thin film on at least one surface of said wafers. The process chamber 10 therefore comprises a receiving opening 12 at a first end 13 of the process chamber 10. In a typical vertical furnace, the array of circular semiconductor wafers comprises a single stack of wafers, wherein the wafers, or at least the surface to be processed, extends substantially perpendicular to the central axis 11 of the process chamber 10. Vertical furnaces may be automated in an easy manner, at least easier than horizontal furnaces. Furthermore, a vertical furnace has a smaller footprint than a horizontal furnace. Due to an increasing demand of solar cells and the fact that vertical furnaces can be automated, a method for processing solar cell substrates 6 in a known vertical furnace 1 is desired. Solar cell substrates 6 have smaller dimensions than the abovementioned wafers for integrated circuit processing. The method provides composing of a suitable loading configuration 14 for solar cell substrates 6 such that the inner space 9 of the process chamber 10 of the vertical furnace 1 can be used optimally. The solar cell substrates 6 may have a substantially circular or square shape.

In FIG. 1, a first example of the loading configuration 14 according to the proposed method is shown. The loading configuration 14 may comprise multiple arrays 16 of mutually spaced solar cell substrates 6 (see also FIGS. 2 and 3). Each array 16 is arranged such that a centre point C of each solar cell substrate S of a single array 16 is located on an imaginary line 17 that extends substantially perpendicular to the solar cell substrate surface 7 to be processed. Furthermore, the imaginary lines 17 of the respective arrays 16 extend preferably substantially parallel at mutual distance d. In other words, the loading configuration 14 may comprise multiple arrays 16 of solar cell substrates 6. Each array 16 comprises a plurality of solar cell substrates 6 that are substantially vertically oriented and substantially horizontally spaced apart. The respective arrays 16 are provided at a plurality of levels located along the central axis 11 of the process chamber 10 in the vertical furnace 1. Due to the provided loading configuration 14, these multiple arrays 16 can be accommodated in the process chamber 10 at the same time resulting in a substantially larger number of solar cell substrates 6 to be processed in a single batch than the number of wafers for integrated circuit processing that usually is processed in a single batch in the vertical furnace 1. Surprisingly, despite the relatively large amount of solar cell substrates 6 provided in the process chamber 10 at the same time, these substrates 6 can still be processed in a desired manner, resulting in a thin film applied on the solar cell substrate surface 7 with a predetermined thickness and quality. The imaginary line 17 may be a substantially straight line as shown in the example of FIGS. 1-3.

It is noted that throughout this application, the term "imaginary line" refers to different kinds of lines for instance a substantially straight line or a substantially curved line, such as a substantially arc shaped or circular line. Thus, the term "imaginary line" has to be interpreted in a broad manner and is not limited to solely straight lines. Furthermore, if two lines are arranged parallel it is to be understood that said respective lines extend in a substantially similar direction but at mutual distance.

Figure 2:
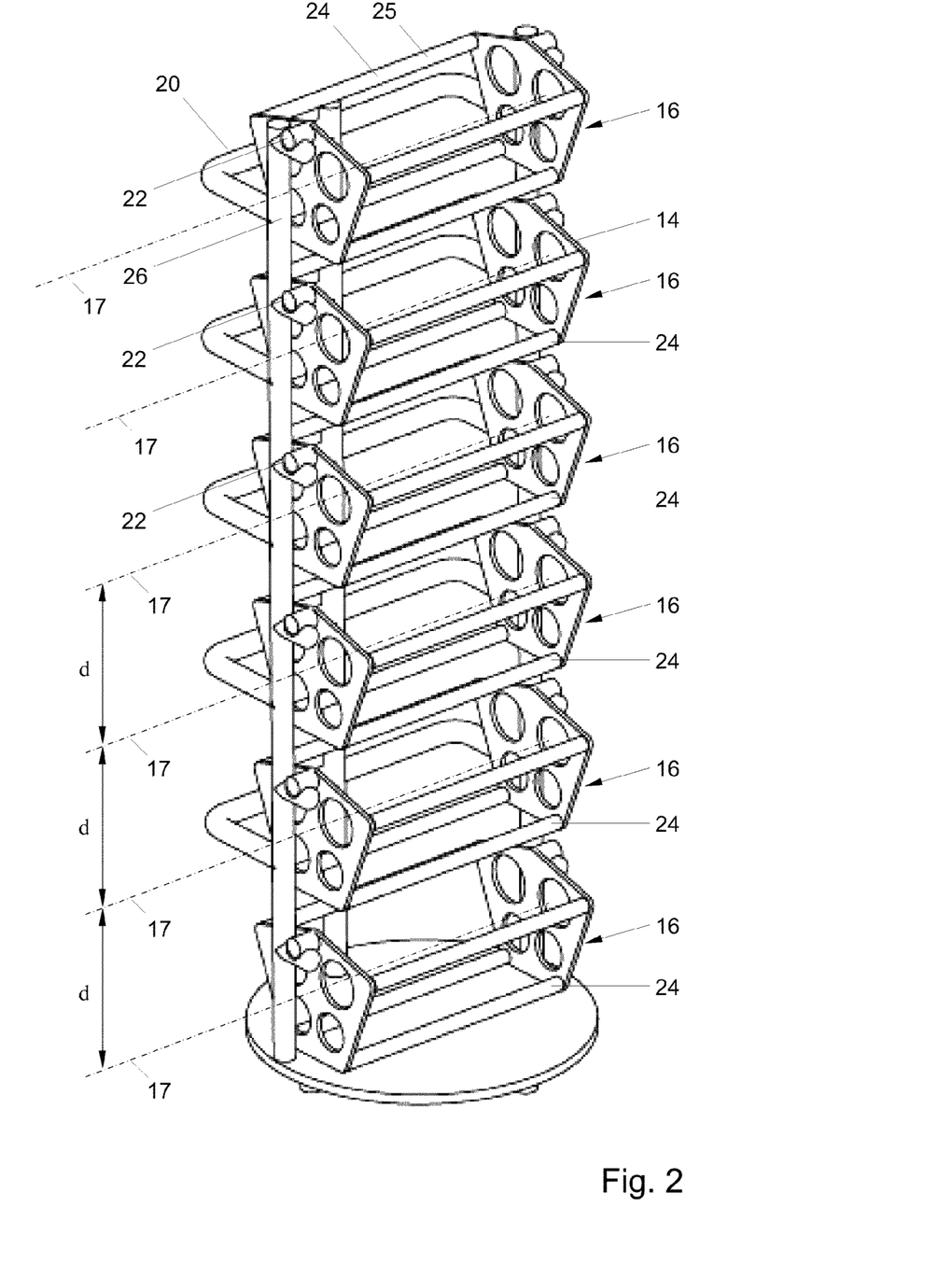
FIG. 2 shows a perspective view of the substrate rack of FIG. 1 with a first example of a loading configuration of solar cell substrates.
Figure 3:
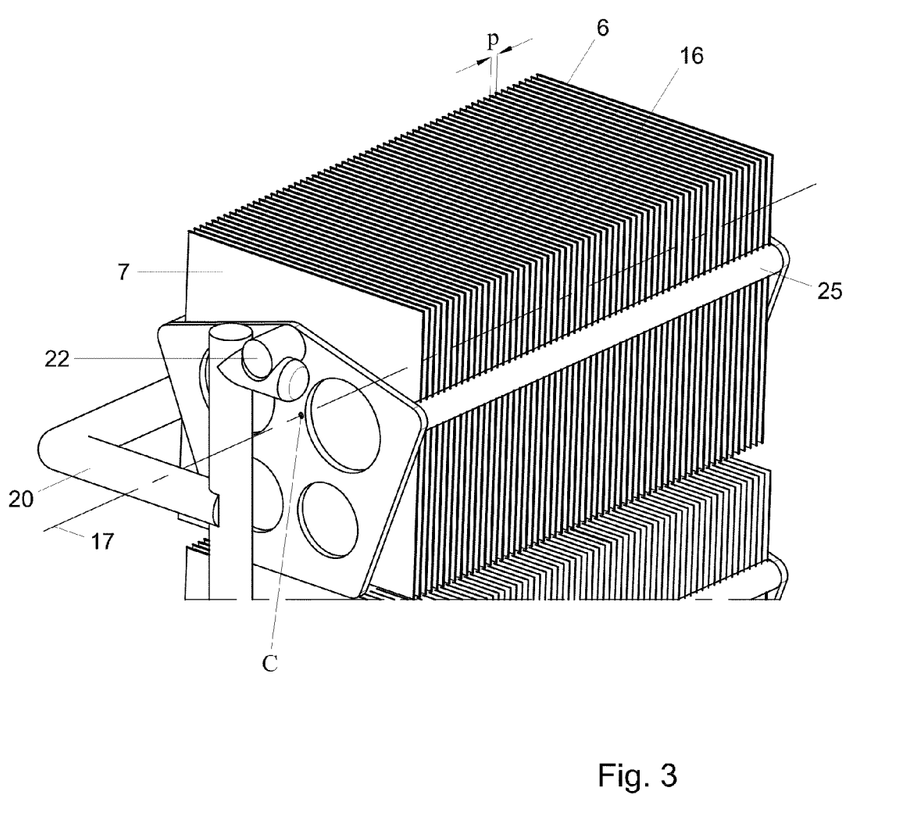
FIG. 3 shows a boat loaded with solar cell substrates of the rack shown in FIGS. 1 and 2.

The loading configuration 14 may be provided by using a substrate rack 20 as shown in FIG. 2. The substrate rack 20 may comprise multiple receiving positions 22 that are arranged for receiving single boats 24 comprising solar cell substrates 6 (see FIG. 3). The rack 20 may comprise an assembly of rods 26 that are interconnected such that the rack 20 fits into the process chamber 10 easily. Solar cell substrates 6 are inserted in the boat 24 before inserting the respective boats 24 into the rack 20. Subsequently, the entire rack 20, including the boats 24 loaded with solar cell substrates 6, is inserted in the process chamber 10 via the inserting opening 12. Due to this loading configuration 14, it is possible to load the substrates 6 into the separate boats 24 at a location horizontally displaced from the process chamber position, for instance in an earlier process step, and/or on a different production location, remote from the vertical furnace. Consequently, the rack 20 can be loaded with substrates 6 in a time efficient manner. Each boat 24 comprises a frame 25, for instance of interconnected rods, with a plurality of receiving openings (not shown). The openings are arranged in a way that the respective solar cell substrates 6 can be received in the respective openings such that the solar cell substrates 6 of one array 16 in a single boat 24 are substantially vertically oriented and mutually horizontally spaced. In case only one surface 7 of the substrates 6 needs to be processed, the solar cell substrates 6 can be loaded back to back in each boat 24, the surfaces of a pair of substrates that do not need to be coated contacting each other. The pitch p between adjacent solar cell substrates 6, or pairs of substrates in case of back to back loading, in such a boat 24 may be small, for instance around 2 mm, for example 2.38 mm. In the rack 20 of the shown example, six boats 24 may be provided. The respective boats 24 are vertically displaced relative to each other, such that the imaginary lines 17 of the respective boats 24 extend at a vertical distance d substantially parallel to each other. Each boat 24 may contain approximately 200 solar cell substrates 6 and consequently, approximately 1200 solar cell substrates 6 may be accommodated in the process chamber 10 at the same time. Although the boats here are shown to be supported by the rack, in an alternative design the boats may be stacked on top of each other, a boat contacting and supported by the boat immediately below it and the lower boat supported on a base.

The proposed method may comprise subjecting the solar cell substrates 6 to an atomic layer deposition (ALD) process. However, it may be possible to subject the solar cell substrates 6 provided in the vertical furnace 1 to other processes as well, such as a POCl3 pre deposition step or an annealing process step. When the solar cell substrate 6 is to be provided with a film layer by means of ALD, it is possible to limit the spacing p between adjacent substrates 6. Deposition with ALD allows for the deposition of a thin film layer in a precisely controlled way. Due to the fact that ALD is a deposition process which deposits one atomic layer at a time through chemisorption until saturation of the surface to be processed, the spacing p may for instance be smaller than 5 mm, for instance smaller than 3 mm and be approximately 2 mm. Consequently, a maximum amount of solar cell substrates 6 may be provided in the loading configuration 14 according to the proposed method. When using a spacing p of approximately 2 mm, relatively thin solar cell substrates 6 that may bend somewhat may still be handled in a desired manner.

Figure 4:
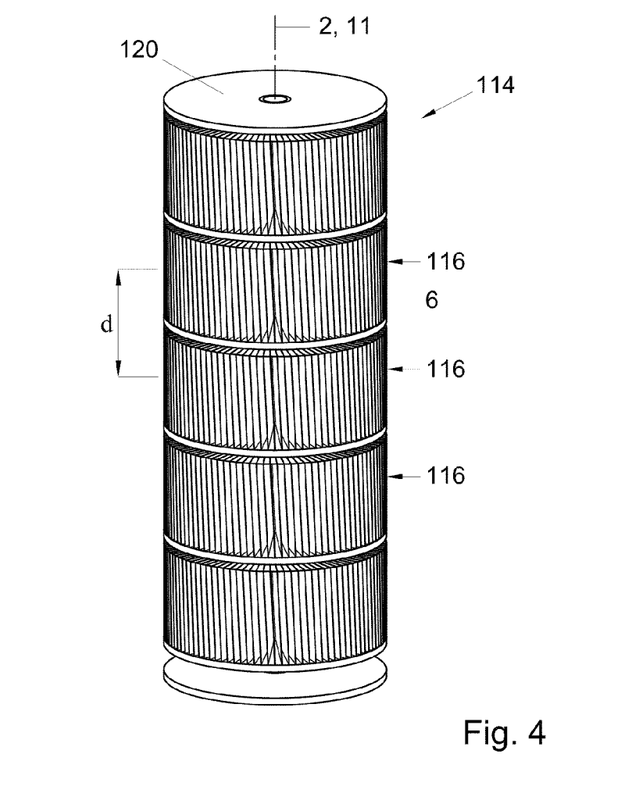
FIG. 4 shows a perspective view of a rack with a second example of a loading configuration of solar cell substrates.
Figure 5:
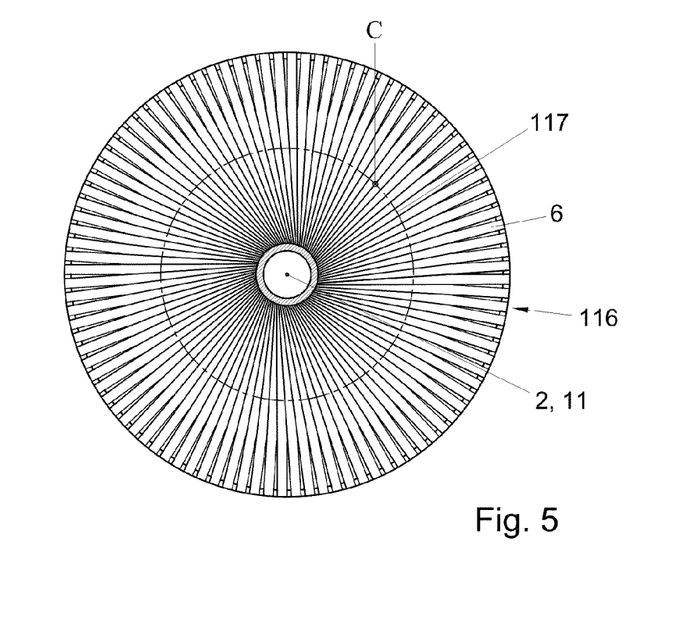
FIG. 5 shows a cross sectional view of the loading configuration of FIG. 4.

FIGS. 4 and 5 show, in a further example of the loading configuration 114 according to the provided method, the solar cell substrates 6 of an array 116 being provided in a polar configuration. For the sake of clarity, only the elements that differ from the example as shown and described with FIGS. 1-3 will be described here in detail. Multiple arrays 116 of substrates 6 are provided in a single boat 120. The boat 120 comprises different levels, wherein each level is arranged to receive an array 116 of substrates 6. The substrates 6 are arranged such that the centre points C of the respective substrates 6 are located on an imaginary circular line 117. Consequently, the substrate surfaces 7 to be processed are radially oriented and extend substantially vertically, which is shown clearly in FIG. 5. In the shown loading configuration 114 of the second example, five arrays 116 are provided at the same time. The respective arrays 116 are vertically displaced relative to each other, such that the imaginary lines 17 of the respective arrays 116 extend at a vertical distance d substantially parallel to each other. When using this loading configuration 114 to process a relatively large number of solar cell substrates 6, approximately 1200 solar cell substrates 6 may be processed in the same batch. The number of solar cell substrates 6 that is mentioned with the first and second example relates to a vertical furnace 1 with a reactor designed for the processing of circular semiconductor wafers for integrated circuit processing, the wafers having a diameter of 300 mm and the solar cells having a square shape of 156×156 mm. When providing a reactor designed for 450 mm wafer processing, up to 3000 solar cell substrates 6 may be provided in the process chamber 10 of the vertical furnace 1 at the same time. Furthermore, the polar configuration of the solar cell substrates 6 according to the second example, having a central gas feed and a radial gas flow pattern enables fast purging. In an alternative embodiment, instead of a single boat 120, the different levels may be formed by separate boats which are stacked on top of each other.

By providing a dual batch system, the method as proposed can provide an increased throughput of processed solar cell substrates 6. The first batch of solar cell substrates 6 can be processed. After processing, the first batch of substrates 6 is removed from the process chamber 10 for cool down. When sufficiently cooled down, the substrates 6 can be unloaded and new substrates 6 to be processed can be loaded. Meanwhile the second batch of substrates 6 is inserted in the process chamber 10 to be processed while the first batch is cooling down, unloaded and a new batch is loaded.

Figure 6:
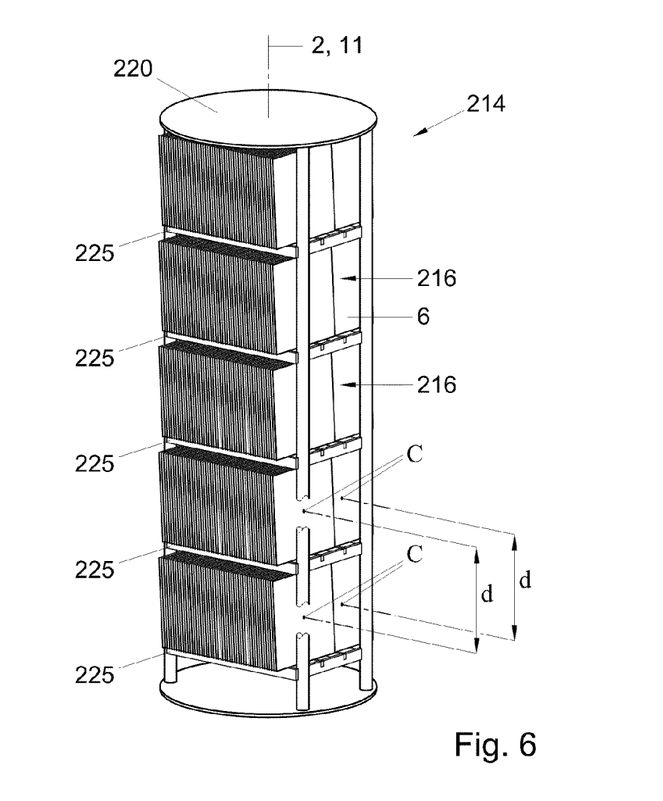
FIG. 6 shows a perspective view of a rack with a third example of a loading configuration of solar cell substrates.
Figure 7:
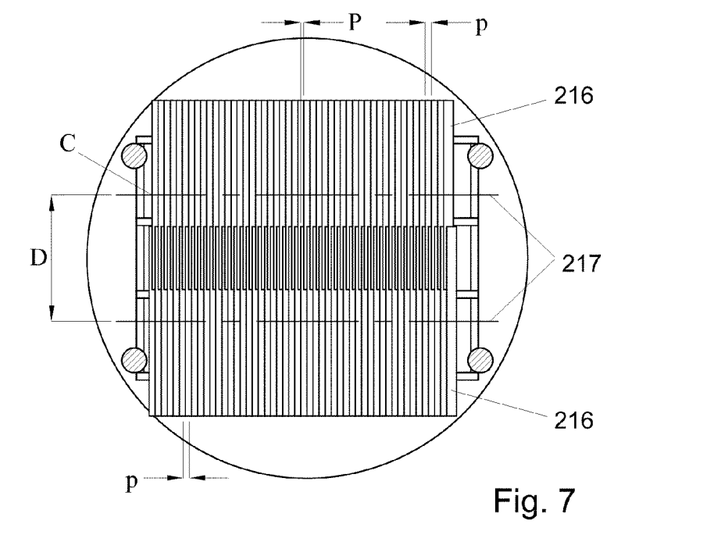
FIG. 7 shows a cross sectional view of the loading configuration of FIG. 6.

A third example of a loading configuration 214 according to the method for processing solar cell substrates 6 is shown in FIGS. 6 and 7. For the sake of clarity, only the elements that differ from the example as shown and described with FIGS. 1-3 will be described here in detail.

The loading configuration 214 as shown in FIG. 6, comprises multiple arrays 216 of solar cell substrates 6. Each array 216 is provided with a stack of mutually spaced and substantially parallel arranged solar cell substrates 6. The boat 220 is loaded with ten arrays 216 on five levels 225. Each level 225 comprises two arrays 216 of substrates 6. The solar cell substrates 6 of each array 216 are vertically oriented and mutually vertically spaced. The centre points C of each array 216 are provided on a substantially straight imaginary line 217. On each level 225, the two adjacent arrays are horizontally displaced relative to each other such that the imaginary lines of the respective arrays 216 extend at a horizontal distance D substantially parallel to each other. Thus, the loading configuration 214 according to the shown example comprises a first set of arrays 216, which set comprises five arrays 216 that are located mutually vertically spaced along the central axis 11 of the process chamber 10. A further, second set of arrays 216 is provided, which second set also comprises five arrays 216 that are provided at five levels 225 located along the central axis 11. Thus, the respective arrays 216 of the second set are also mutually vertically displaced. The first set and the second set are horizontally displaced relative to each other, such that the imaginary lines 217 of the respective arrays 216 of the respective first and second sets extend at a horizontal distance substantially parallel to each other.

Furthermore, the adjacent arrays 216 of the same level 225 partially overlap each other, as is clearly visible in FIG. 7. The solar cell substrates 6 of the first array partially extend between two adjacent solar cell substrates 6 of the second array. Consequently, the pitch P between the overlapping solar cell substrates 6 is smaller than the pitch p between the solar cell substrates 6 of each array 216. The respective levels 225 are located above each other in the boat 220. Consequently, the arrays 216 of the respective levels 225 are vertically displaced relative to each other, such that the imaginary lines 17 of the arrays of a first level 225 extend, preferably substantially parallel, at a vertical distance d from the imaginary lines 17 of a second level 225.

Although in the example shown in FIGS. 6 en 7 the substrates 6 of two arrays 216 provided on the same level 225 partially overlap, in a different example the respective arrays 216 on the same level 225 may be provided next to each other without overlapping.

In the abovementioned examples, the solar cell substrates 6 are substantially vertically oriented at all times. Since the solar cell substrates 6 are relatively thin and thus may be bend easily, the vertical orientation may prevent undesired breakage of the solar cell substrates 6 during processing.

Figure 8:
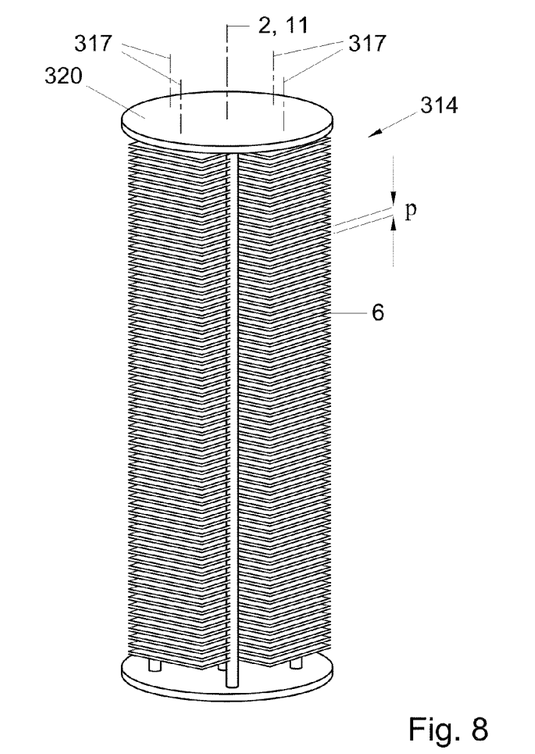
FIG. 8 shows a perspective view of a rack with a fourth example of a loading configuration of solar cell substrates.
Figure 9:
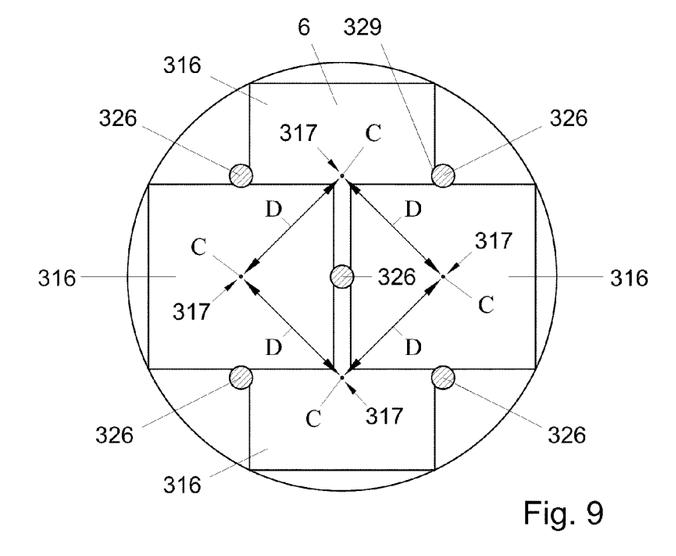
FIG. 9 shows a cross sectional view of the loading configuration of FIG. 8.

The last example of a loading configuration 314 of the provided method for processing solar cell substrates is shown in FIGS. 8 and 9. For the sake of clarity, only the elements that differ from the examples as shown and described with the previous Figures will be described here in detail. The shown loading configuration 314 comprises four arrays 316 of mutually spaced and substantially parallel arranged solar cell substrates 6. The substrates 6 of each array 316 are horizontally oriented and mutually vertically spaced. The centre points C of the substrates 6 of each array 316 are located on respective imaginary lines 317. Said imaginary lines 317 extend substantially parallel to the central axis 11 of the process chamber 10. Thus, the respective arrays 316 extend in a direction substantially parallel to said central axis 11. The respective arrays 316 are horizontally displaced relative to each other, such that the respective imaginary lines 317 of the respective arrays 316 extend at a vertical distance D substantially parallel to each other. Furthermore, the substrates 6 of the respective arrays 316 partially overlap as is shown in FIG. 9. With the configuration 314 according to this example, approximately 1600 solar cell substrates 6 may be provided in the process chamber 10 at the same time when using a 300 mm reactor. In case of usage of a 450 mm reactor, even approximately 4400 solar cell substrates 6 may be processed in a single batch. The four arrays 316 are provided in a boat 324 that comprises at least five rods 326 that extend from a first end 327 to a second end 328 of the boat 320. Each rod 326 comprises multiple receiving openings 329 that are arranged at mutual distance along the rods 326. The substrates 6 of a single array 316 are received in the receiving openings 329 of at least three rods 326, as can be seen in FIG. 9, such that adjacent substrates 6 are spaced apart along spacing p.

The substrates can be regular semiconductor wafers wherein a p/n junction is formed between the front and rear surface of the wafer. Alternatively, the substrates can be semiconductor wafers in accordance with the sliver technology as described in US Patent Application Publication No. 2004/0097012. In this technology a plurality of parallel elongated slots are formed at least partly through a semiconductor wafer to form a series of semiconductor strips or slivers. The width of the slots and the thickness of the strips are selected such that the thickness of the wafer is larger than the sum of the slot width and the strip thickness. Cells produced by this method are bifacial—that is, these respond equally well to sunlight impinging on either surface. The slivers are preferably processed when still supported in the wafer. ALD is a suitable technology to form a uniform passivation layer on both the sliver sidewall surfaces down the narrow slots because of the self limiting nature of the process. After completion of the process, the slivers are cut from the wafer and laid flat side by side, resulting in a solar cell surface area that is larger than the original semiconductor wafer.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. It will be clear, for example, that the multiple arrays can be provided in a different configuration, for instance due to a certain design of the boat or rack, or depending on the kind, shape and dimensions of the solar cell substrates to be processed. Furthermore, the rack or boat may have a different construction, for instance a different rod assembly comprising a different amount of rods and different receiving openings adapted to receive the respective solar cell substrates. The solar cell substrates of different adjacent arrays may not overlap or may at least partially overlap. The pitch or spacing between adjacent solar cell substrates may be determined dependent on the kind of process to be used to apply the thin film on the surface of the solar cell substrate. Loading and unloading of the boat or rack may be conducted in different manners, depending on the production process of which the vertical furnace provides a process step.

Reference throughout this specification to "one embodiment" or "an embodiment" means that a particular feature, structure or characteristic described in connection with the embodiment is included in at least one embodiment in the present invention. Thus, the appearances of the phrases "in one embodiment" or "in an embodiment" in various places throughout this specification are not necessarily all referring to the same embodiment. Furthermore, it is noted that particular features, structures or characteristics of one or more embodiments may be combines in any suitable manner to form new, not explicitly described embodiments.

We claim:

1. A method for processing solar cells comprising:
    providing a vertical furnace configured for batch processing, the furnace having a substantially cylindrical, vertically extending process chamber adapted to receive an array of mutually spaced circular semiconductor wafers for integrated circuit processing;
    providing a plurality of solar cell substrates, the solar cell substrates having a first surface to be processed, wherein a size of the solar cell substrates that extends along the first surface is smaller than a corresponding size of the circular semiconductor wafers;
    composing the plurality of solar cell substrates into a process chamber loading configuration, wherein the loading configuration comprises multiple arrays of solar cell substrates, wherein each array comprises a plurality of solar cell substrates that are substantially vertically oriented and substantially horizontally spaced apart, wherein the respective arrays are provided at a plurality of levels located along a central axis of the process chamber in the vertical furnace and wherein a number of solar cell substrates that can be accommodated in the process chamber is substantially larger than a number of circular semiconductor wafers, wherein the composing step further comprises:
        loading each array of solar cell substrates, which are substantially vertically oriented and substantially horizontally spaced apart, into a boat at a location horizontally displaced from the process chamber position,
        placing each boat in a rack with the arrays at the plurality of levels, and
        loading the rack with multiple boats loaded with the substrates into the process chamber; and
    subjecting the solar cell substrates to a process in the process chamber.

2. Method according to claim 1, wherein the solar cell substrates in the process chamber are subjected to an atomic layer deposition (ALD) process to provide a thin film on the solar cell substrate surface.

3. Method according to claim 1, wherein the array is a stack of mutually spaced and substantially parallel arranged solar cell substrates.

4. Method according to claim 1, wherein a centre point of each solar cell substrate of an array is located on an imaginary line that extends substantially perpendicular to the solar cell surface, wherein the imaginary lines of the respective arrays extend, preferably substantially parallel at mutual distance.

5. Method according to claim 1, wherein a space between adjacent solar cell substrates of an array is smaller than 5 mm.

6. Method according to claim 1, wherein the solar cell substrates have a circular or square shape.

7. Method according to claim 1, wherein a space between adjacent solar cell substrates of an array is smaller than 3 mm.

8. Method according to claim 1, wherein a space between adjacent solar cell substrates of an array is approximately 2 mm.

9. Method according to claim 1, wherein the multiple arrays provided at the plurality of levels along the central axis of the process chamber together form a first set of arrays, wherein the loading configuration further comprises at least a second set of arrays, which second set also comprises a plurality of arrays located at a plurality of levels located along the central axis, wherein the first set and the second set are horizontally displaced relative to each other.

10. Method according to claim 1, wherein each array has a polar configuration, wherein each substrate, at least the surface to be processed of each substrate, is substantially radially oriented, such that the imaginary line through the centre points of the respective substrates has a substantially circular shape.

11. Method according to claim 1, wherein adjacent arrays in the loading configuration partially overlap each other, such that solar cell substrates of a first array at least partially extend between two adjacent solar cell substrates of a second adjacent array.

* * * * *